(12) United States Patent
Ishioka et al.

(10) Patent No.: US 10,779,408 B2
(45) Date of Patent: Sep. 15, 2020

(54) PRINTED WIRING BOARD

(71) Applicant: KYOCERA Corporation, Kyoto-shi, Kyoto (JP)

(72) Inventors: Takashi Ishioka, Namerikawa (JP); Hidetoshi Yugawa, Kyoto (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 16/575,468

(22) Filed: Sep. 19, 2019

(65) Prior Publication Data

US 2020/0120799 A1    Apr. 16, 2020

(30) Foreign Application Priority Data

Sep. 26, 2018 (JP) .................................. 2018-180734
Jun. 26, 2019 (JP) .................................. 2019-118994

(51) Int. Cl.
*H05K 1/11* (2006.01)

(52) U.S. Cl.
CPC ..... *H05K 1/116* (2013.01); *H05K 2201/0959* (2013.01); *H05K 2201/09645* (2013.01); *H05K 2201/09827* (2013.01)

(58) Field of Classification Search
CPC ........... H05K 1/116; H05K 2201/0959; H05K 2201/09645; H05K 2201/09827
USPC ......................................................... 174/264
See application file for complete search history.

(56) References Cited

U.S. PATENT DOCUMENTS

2016/0374199 A1* 12/2016 Kondo ................. H05K 1/0298

FOREIGN PATENT DOCUMENTS

JP          2000-244129 A    9/2000

* cited by examiner

*Primary Examiner* — Tremesha S Willis
(74) *Attorney, Agent, or Firm* — Volpe and Koenig, P.C.

(57) ABSTRACT

The printed wiring board of the present disclosure includes: a plurality of insulating layers laminated in a thickness direction; a plurality of wiring conductors respectively correspondingly positioned between the plurality of insulating layers; a through hole penetrating the plurality of insulating layers and the plurality of wiring conductors in the thickness direction; and a through-hole conductor positioned on a wall surface of the through hole; each of the plurality of wiring conductors has a first surface facing the through hole, each of the plurality of insulating layers has a second surface facing the through hole, and the first surface is farther away from a central axis penetrating the through hole in the thickness direction than the second surface.

8 Claims, 4 Drawing Sheets

PRINTED WIRING BOARD

BACKGROUND OF THE INVENTION

1. Technical Field

The present disclosure relates to a printed wiring board.

2. Background

Currently, printed wiring boards mounted with highly functional package substrates and electronic components have been developed. The printed wiring board includes a plurality of laminated insulating layers and wiring conductors. The wiring conductor is positioned on the upper and lower surfaces of the laminated insulating layers and between the insulating layers. The wiring conductors located in different layers are electrically connected by through-hole conductors in the through holes that penetrate the insulating layer in the thickness direction. Such a printed wiring board is mounted with package substrates, electronic components, and the like, and is mounted on an electronic apparatus such as a server.

In recent years, with the increased functionality of electronic apparatuses, the increased functionality of package substrates and electronic components has advanced, and the number of signal systems and the amount of power supply tend to increase. Therefore, the printed wiring board is requested to increase a number of wiring conductors. In order to meet such a request, the printed wiring board may secure a wiring conductor formation region by increasing the number of insulating layers. For example, JP 2000-244129 A describes a wiring board including a layered capacitor including a composite dielectric layer and a metal layer at a position close to an electronic component such as an IC chip.

SUMMARY

A printed wiring board according to the present embodiment includes: a plurality of insulating layers laminated in a thickness direction; a plurality of wiring conductors respectively correspondingly positioned between the plurality of insulating layers; a through hole penetrating the plurality of insulating layers and the plurality of wiring conductors in the thickness direction; and a through-hole conductor positioned on a wall surface of the through hole. A first surface of each of the plurality of wiring conductors facing the through hole is positioned outside a second surface of each of the plurality of insulating layers facing the through hole with respect to a central axis penetrating the through hole in the thickness direction.

DETAILED DESCRIPTION

Figure 1:
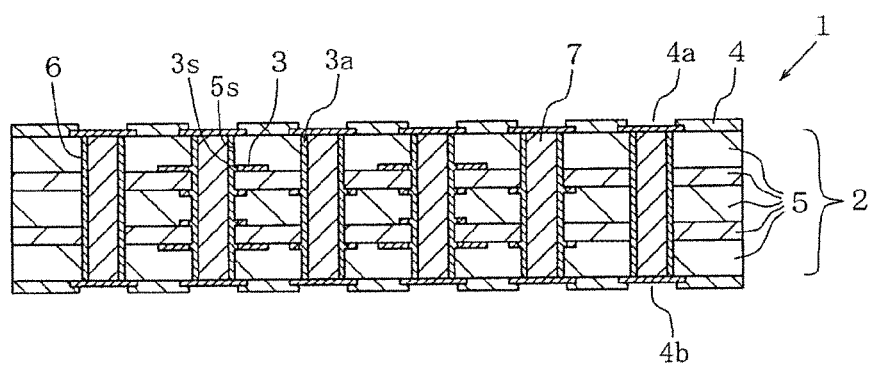
FIG. 1 is a schematic cross-sectional view illustrating an exemplary embodiment of a printed wiring board according to the present disclosure.

Next, a printed wiring board according to the present disclosure will be described with reference to FIGS. 1 and 2. A printed wiring board 1 includes an insulating base 2, a wiring conductor 3, and a solder resist 4. The printed wiring board 1 is mounted with a wiring board such as a package substrate, or an electronic component or the like on the upper surface, for example. The printed wiring board 1 has a thickness of about 0.04 to 10.0 mm.

The insulating base 2 includes five insulating layers 5 laminated in the thickness direction. The insulating layer 5 contains an insulating material made of reinforcing glass cloth impregnated with an epoxy resin, a bismaleimide triazine resin, or the like, for example. The insulating base 2 has a function of securing the arrangement region of the wiring conductor 3 in the printed wiring board 1, a function as a support for maintaining flatness, and the like. The thickness of each insulating layer 5 is set to 20 to 400 µm, for example.

This insulating base 2 is formed as follows, for example. First, two double-sided copper-clad laminates are prepared. The double-sided copper-clad laminate is obtained by, for example, pasting copper foil on the upper and lower surfaces of an insulating plate made of glass cloth impregnated with an insulating resin. Next, by etching the copper foil of each double-sided copper-clad laminate, a wiring conductor 3 having a predetermined pattern is formed. Next, three sheets of prepreg and two sheets of copper foil are prepared. The prepreg is a semi-cured insulating material made of glass cloth impregnated with an insulating resin. Next, with a single sheet of prepreg as the center, a double-sided copper-clad laminate, the prepreg, and the copper foil are laminated in this order on each of the upper and lower surfaces of the prepreg. Next, performing press work under heating forms the insulating base 2 as described above.

The wiring conductor 3 formed based on the copper foil of the double-sided copper-clad laminate as described above may have crystal grains elongated in the thickness direction, for example. In other words, many crystal interfaces between crystal grains face the thickness direction, and few crystal interfaces face the horizontal direction orthogonal to the thickness direction. For this reason, it is advantageous in that it is possible to improve the fracture resistance of the wiring conductor 3 when the printed wiring board 1 is thermally expanded and stress in the thickness direction is applied.

The insulating base 2 includes a plurality of through holes 6 penetrating in the thickness direction. Some of the through holes 6 have the second surfaces 5s of the plurality of insulating layers and the first surfaces 3s of the plurality of wiring conductors exposed inside thereof. The wiring conductors 3 on the upper and lower surfaces of the insulating base 2 or the wiring conductors 3 between the upper and lower surfaces of the insulating base 2 and between the insulating layers 5 are electrically connected through the through hole 6. The diameter of the through hole 6 is set to 50 to 2000 µm, for example.

Figure 2:
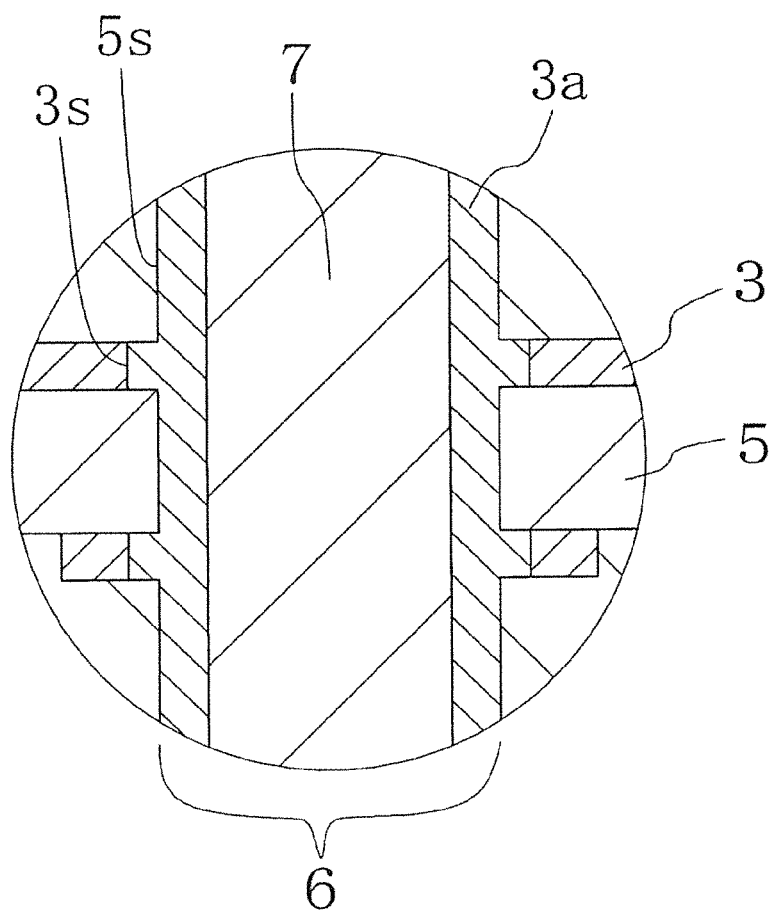
FIG. 2 is an enlarged cross-sectional view illustrating a main part of an exemplary embodiment of the printed wiring board according to the present disclosure.

As shown in FIG. 2, in the through hole 6, the first surface 3s of each wiring conductor is positioned outside the second surface 5s of the insulating layer with respect to the central axis penetrating the through hole 6 in the thickness direction. The difference between the first surface 3s of the wiring conductor and the second surface 5s of the insulating layer is set in a range of 1 to 10 µm, for example.

If the difference between the two is less than 1 µm, the distance by which a part of a through-hole conductor 3a described later can enter the outside of the second surface 5s of the insulating layer is small. Therefore, the effect of locking the through-hole conductor 3a to the insulating layer 5 is reduced. If the difference between the two is larger than 10 µm, the plating treatment liquid may not favorably circulate to the first surface 3s of the wiring conductor when the through-hole conductor 3a is formed as described later, and the copper-plated metal may not be favorably deposited. Therefore, the connection between the through-hole conductor 3a and the first surface 3s of the wiring conductor may be incomplete. Considering these viewpoints, it is advantageous in quality and production if the difference between the first surface 3s of the wiring conductor and the second surface 5s of the insulating layer is set to 3 to 7 µm.

This through hole 6 is formed as follows, for example. First, a through hole penetrating the insulating base 2 in the thickness direction is formed by drilling. Next, the resin waste remaining in the through hole is removed by desmear treatment. Finally, the wiring conductor 3 exposed in the through hole 6 is etched and dissolved until the above-described difference is reached. Thus, the through hole 6 as described above is formed.

This etching treatment also has an effect of removing metal waste that cannot be removed by the desmear treatment and resin waste stuck to the first surface 3s of the wiring conductor exposed in the through hole.

The wiring conductor 3 is positioned between the insulating layers 5, on the upper and lower surfaces of the insulating base 2, and in the through hole 6. The wiring conductor 3 constitutes a conductive path of the printed wiring board 1, and has functions such as signal propagation and power supply. The wiring conductor 3 includes a highly conductive metal such as copper.

Among these wiring conductors 3, the one positioned in the through hole 6 functions as the through-hole conductor 3a. Each through-hole conductor 3a has a function for a signal used for signal propagation, a power supply used for power supply, or a grounding function. The through-hole conductor 3a electrically connects the wiring conductors 3 on the upper and lower surfaces of the insulating base 2, or the wiring conductors 3 on the upper and lower surfaces of the insulating base 2, and the wiring conductors 3 between the insulating layers 5.

The through-hole conductor 3a is positioned in close contact with the entire surface of the first surface 3s of the wiring conductor and the second surface 5s of the insulating layer facing the through hole 6, and has a cylindrical shape having a cavity at the central part in the radial direction of the through hole 6. As described above, the first surface 3s of the wiring conductor is positioned outside the second surface 5s of the insulating layer with respect to the central axis that penetrates the through hole 6 in the thickness direction. Therefore, a part of the through-hole conductor 3a is positioned so as to enter between the insulating layers 5.

In other words, in the through hole 6, the portion where the first surface 3s of the wiring conductor is exposed is in a state of being recessed with respect to the second surface 5s of the insulating layer. The through-hole conductor 3a is in close contact with the first surface 3s of the wiring conductor in the depression and is also in close contact with the second surface 5s of the insulating layer.

Increasing the contact area between the through-hole conductor 3a and the second surface 5s of the insulating layer is advantageous for improving the adhesion strength of the through-hole conductor 3a. In particular, in the thickness direction, the through-hole conductor 3a in the depression functions as locking to the insulating layer 5, whereby the shear stress between the through-hole conductor 3a and the insulating layer 5 can be reduced. Furthermore, it is also possible to reduce the shear stress between the through-hole conductor 3a and the first surface 3s of the wiring conductor.

The first surface 3s of the wiring conductor facing the through hole 6 has a linear shape in the sectional view shown in FIG. 2, but may have a curved shape. In this case, the contact area with the through-hole conductor 3a increases. This is advantageous in that the adhesion strength between the first surface 3s of the wiring conductor and the through-hole conductor 3a can be improved.

In the through hole 6, a hole-filling resin 7 filled in the cavity of the through-hole conductor 3a is positioned. The hole-filling resin 7 is not essential in the present disclosure, but is used when the printed wiring board 1 has a structure of closing the upper and lower openings of the through hole 6 with, for example, a conductor layer, an insulating layer or the like.

Filling the inside of the through-hole conductor 3a with the hole-filling resin 7 in the through hole 6 makes it less likely that gas and liquid remain in the through hole 6. Thus, it is possible to avoid damage or corrosion of the wiring conductor 3 or the like due to gas expansion, liquid corrosion or the like.

The hole-filling resin 7 includes, for example, a thermosetting resin such as an epoxy resin and insulating particles such as silica.

The wiring conductor 3 positioned in upper and lower surfaces of the insulating base 2 and in the through hole 6 are formed as follows, for example.

First, the insulating base 2 in which the through hole 6 is formed by the above-described process is prepared. Next, electroless copper plating treatment and electrolytic copper plating treatment are sequentially performed on the upper and lower surfaces of the insulating base 2, the first surface 3s of the wiring conductor facing the through hole 6, and the second surface 5s of the insulating layer. The copper plating metal deposited on the first surface 3s of the wiring conductor and the second surface 5s of the insulating layer becomes the through-hole conductor 3a. Next, the hole-filling resin 7 is filled inside the copper plated metal in the through hole 6 and cured. Next, the hole-filling resin 7 protruding from the through hole 6 is polished so that the copper plated metal deposited on the upper and lower surfaces of the insulating base 2 and the exposed surface of the hole-filling resin 7 have the same height. Finally, the copper plated metal deposited on the upper and lower surfaces of the insulating base 2 and the exposed surface of the hole-filling resin 7 are plated, and forming a predetermined pattern by etching forms wiring conductors 3 on the upper and lower surfaces of the insulating base 2.

The through-hole conductor 3a may have crystal grains with random crystal interface directions. That is, the crystal interface of the through-hole conductor 3a has no directionality. In such a case, it is advantageous in that the thermal stress applied to the through-hole conductor 3a can be dispersed in a random direction.

The solder resist 4 is positioned on the upper surface of the uppermost insulating layer 5 and on the lower surface of the lowermost insulating layer 5. The solder resist 4 includes an opening 4a for exposing a part of the wiring conductor 3 positioned on the upper surface of the insulating base 2 and an opening 4b for exposing a part of the wiring conductor 3 positioned on the lower surface.

A part of the wiring conductor 3 exposed to the opening 4a functions as an electrode connected to an electrode of a package substrate or an electronic component, for example.

A part of the wiring conductor 3 exposed to the opening 4b functions as an electrode connected to an electronic component, for example.

The solder resist 4 is formed by pasting, for example, a thermosetting resin film having photosensitivity such as an acrylic-modified epoxy resin to the surface of the insulating layer 5 to form the opening 4a or opening 4b by exposure and development to be thermally cured.

As described above, the printed wiring board 1 of the present disclosure includes a plurality of insulating layers 5 laminated in the thickness direction, a plurality of wiring conductors 3 respectively correspondingly positioned between the plurality of insulating layers 5, and a through hole 6 penetrating the plurality of insulating layers and the plurality of wiring conductors in the thickness direction. The second surface 5s of the plurality of insulating layers and the first surface 3s of the plurality of wiring conductors are exposed from the through hole 6. A through-hole conductor 3a in close contact with the entire surface of the second surface 5s of the insulating layer and the first surface 3s of the wiring conductor is positioned in the through hole 6. Then, in the through hole 6, the first surfaces 3s of the plurality of wiring conductors are positioned outside the second surfaces 5s of the plurality of insulating layers with respect to the central axis penetrating the through hole 6 in the thickness direction. That is, in the through hole 6, the portion where the first surface 3s of the wiring conductor is exposed is in a state of being recessed with respect to the second surface 5s of the insulating layer.

Therefore, the through-hole conductor 3a is in close contact with the first surface 3s of the wiring conductor and the second surface 5s of the insulating layer in a state where a part of the through-hole conductor 3a enters the depression. This increases the contact area between the through-hole conductor 3a, and the first surface 3s of the wiring conductor and the second surface 5s of the insulating layer, which is advantageous in improving the adhesion strength of the through-hole conductor 3a. In particular, in the thickness direction, the through-hole conductor 3a in the depression functions as locking to the insulating layer 5, whereby the shear stress between the through-hole conductor 3a and the insulating layer 5 can be reduced. As a result, it is possible to decrease breakage between the through-hole conductor 3a and the first surface 3s of the wiring conductor.

Thus, according to the present disclosure, it is possible to decrease breakage between the through-hole conductor 3a having a function for signal, power supply, or ground and the first surface 3s of the wiring conductor. Therefore, a printed wiring board excellent in signal propagation or power supply characteristics can be provided.

The present disclosure is not limited to one example of the above-described embodiment, and various modifications are possible without departing from the scope of the present disclosure.

For example, in one example of the above-described embodiment, a state in which there is no recess at the interface between the through-hole conductor 3a and the hole-filling resin 7 as shown in FIG. 2.

Figure 3:
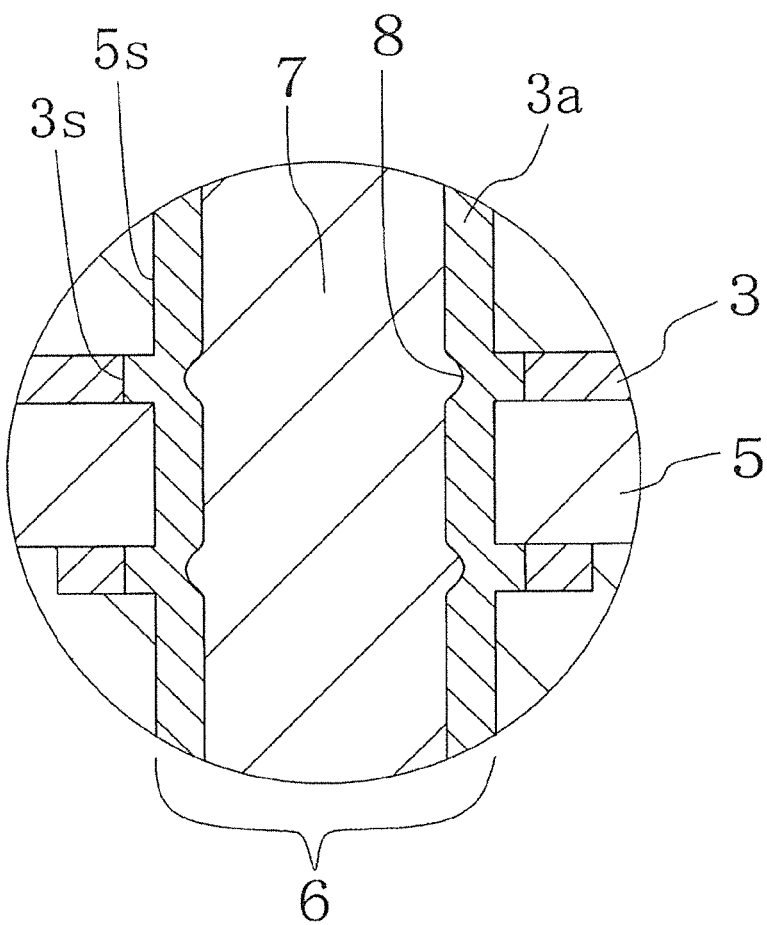
FIG. 3 is a schematic cross-sectional view illustrating a main part of another exemplary embodiment of the printed wiring board according to the present disclosure.

Apart from this case, as shown in FIG. 3, the through-hole conductor 3a may have annular recesses 8 on the inner peripheral surface facing the first surfaces 3s of the plurality of wiring conductors facing the through hole 6. That is, the inner peripheral surface of the cylindrical through-hole conductor 3a has annular recesses 8 at the positions facing the above-described depressions.

In such a case, for example, when thermal expansion occurs in the printed wiring board 1, the through-hole conductor 3a is pressed in the direction of the first surface 3s of the wiring conductor by the hole-filling resin 7 having entered the recess 8. Thus, the adhesion strength between the through-hole conductor 3a and the first surface 3s of the wiring conductor is improved.

The depth of the recess 8 is set to 2 to 5 μm, for example. If the depth of the recess 8 is smaller than 2 μm, there is a possibility that the effect of the above pressing is reduced and that this cannot contribute to improve the adhesion strength between the through-hole conductor 3a and the first surface 3s of the wiring conductor. If the depth of the recess 8 is larger than 5 μm, it may be difficult to fill the hole-filling resin 7 into the recess 8.

This recess 8 is formed by adjusting the electroplating treatment time so that the portion where the first surface 3s of the wiring conductor is exposed has a thickness to the extent that the shape of depression with respect to the second surface 5s of the insulating layer remains. It should be noted that if the recess 8 is unnecessary, the electroplating treatment time has only to be further extended or the electroplating treatment has only to be performed twice.

Figure 4:
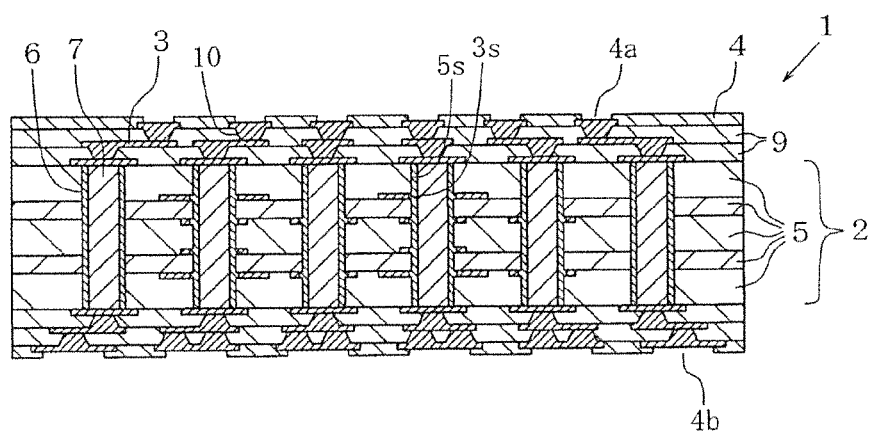
FIG. 4 is a schematic cross-sectional view illustrating another exemplary embodiment of the printed wiring board according to the present disclosure.

As shown in FIG. 4, the buildup insulating layer 9 and the wiring conductor 3 may be further laminated on the upper and lower surfaces of the insulating base 2. In the present example, two layers of buildup insulating layers 9 and wiring conductors are positioned on each of the upper surface and the lower surface.

The buildup insulating layer 9 has a function of securing regions for arranging the wiring conductors 3 on the upper and lower surfaces of the insulating base 2. Therefore, the structure having the buildup insulating layer 9 corresponds to an increase in the signal system and the power supply accompanying the increased functionality of the electronic apparatus. Therefore, it is advantageous in that the number of wiring conductors 3 of the printed wiring board 1 can be increased.

The buildup insulating layer 9 covers the wiring conductor 3 and has a function of securing insulation between the wiring conductors 3 adjacent to each other.

The buildup insulating layer 9 includes glass fibers such as E glass or S glass, insulating resin such as polyimide resin, epoxy resin, or bismaleimide triazine resin, and insulating particles such as silica ($SiO_2$) or alumina ($Al_2O_3$). The glass fiber does not have to be included.

The buildup insulating layer 9 is formed by depositing an insulating layer film onto the upper and lower surfaces of the insulating base 2 or the surface of the already formed buildup insulating layer 9 under vacuum so that the wiring conductor 3 is covered, and then by curing the insulating layer film by thermocompression bonding, for example.

The buildup insulating layer 9 includes a plurality of via holes 10 having the wiring conductor 3 as a bottom surface. The wiring conductors 3 positioned above and below via the buildup insulating layer 9 are electrically connected via the wiring conductor 3 in the via hole 10. The diameter of the via hole 10 is set to, for example, 30 to 100 μm.

The via hole 10 is formed by performing laser processing treatment on the buildup insulating layer 9, for example.

After laser processing, cleaning the inside of the via hole 10 to remove foreign matters such as carbide allows the adhesion strength between the wiring conductor 3, and the buildup insulating layer 9 and the wiring conductor 3 exposed in the via hole 10 to be improved.

The wiring conductor 3 is positioned in the upper or lower surface of the buildup insulating layer 9 and in the via hole 10. The wiring conductor 3 is formed by a plating processing technique such as a semi-additive method or a subtractive method, and includes a highly conductive metal such as copper.

Solder resist 4 is positioned on the upper surface of the uppermost buildup insulating layer 9 and on the lower surface of the lowermost buildup insulating layer 9. The solder resist 4 includes an opening 4a for exposing a part of the wiring conductor 3 positioned on the upper surface of the buildup insulating layer 9, and an opening 4b for exposing a part of the wiring conductor 3 positioned on the lower surface of the buildup insulating layer 9.

A part of the wiring conductor 3 exposed to the opening 4a functions as an electrode connected to an electrode of a package substrate or an electronic component, for example. A part of the wiring conductor 3 exposed to the opening 4b functions as an electrode connected to an electronic component, for example.

Figure 5A:
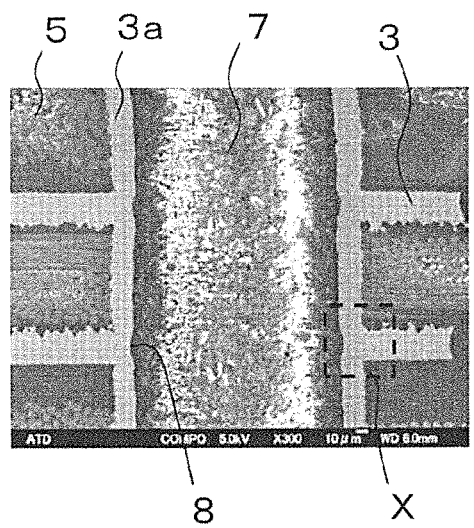
FIG. 5A is an electron micrograph of a portion shown in the schematic cross-sectional view in FIG. 3.
Figure 5B:
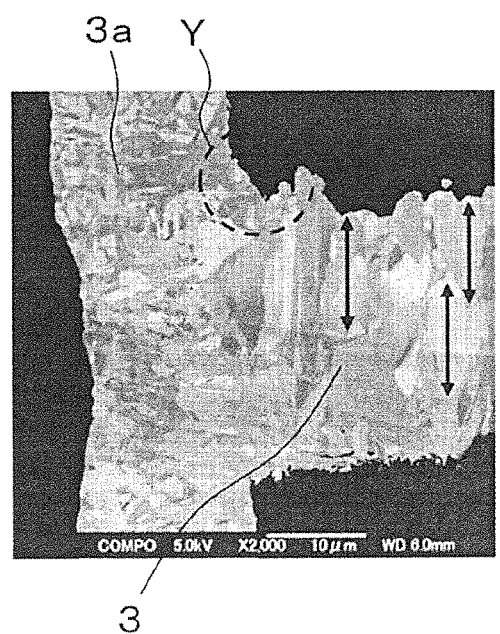
FIG. 5B is an enlarged photograph of a region X shown in FIG. 5A.

FIG. 5A shows an electron micrograph of the portion shown in the schematic cross-sectional view in FIG. 3. FIG. 5B shows an enlarged photograph of the region X shown in FIG. 5A. The reference numerals shown in FIGS. 5A and 5B are the same as those shown in FIG. 3, and the description will be omitted.

For example, in FIGS. 2 and 3, the position of the first surface 3s of the wiring conductor is clearly shown. Only for convenience, this shows the position of the first surface 3s of the wiring conductor when shown in the sectional view, but as shown in FIG. 5B, a state where the first surface 3s of the wiring conductor is unclear, that is, a state where the boundary surface between the first surface 3s of the wiring conductor and the through-hole conductor 3a is nonlinearly intertwined and harmoniously integrated as a whole may be used. That is, when the wiring conductor 3 is etched, the first surface 3s of the wiring conductor is processed into a state of nonlinearly intertwined, in other words, processing the first surface 3s of the wiring conductor into an uneven shape and depositing copper-plated metal to be the through-hole conductor 3a leads the boundary surface between the first surface 3s of the wiring conductor and the through-hole conductor 3a into the above state.

The conductor forming the wiring conductor 3 has a crystal extending in the depth direction of the through hole 6, that is, the direction along the central axis of the through hole 6, as indicated by an arrow in FIG. 5B. In other words, the crystal has a long shape extending in the laminating direction of the upper insulating layer 5 and the lower insulating layer 5 in a sectional view. Thus, when the conductor crystal forming the wiring conductor 3 extends in the depth direction of the through hole 6, the wiring conductor 3 can be more firmly stuck to the insulating layer 5. For example, when a load is applied to the printed wiring board, the through-hole conductor 3a is likely to be loaded in a direction perpendicular to the depth direction of the through hole 6, that is, in a direction horizontal to the main surface of the wiring conductor 3 or the insulating layer 5. Even if such a load is applied to the wiring conductor 3, since the wiring conductor 3 is more firmly stuck to the insulating layer 5, the displacement of the through-hole conductor 3a due to the load can be reduced, and the wiring conductor 3 can be made more difficult to break. Here, the crystal extending in the direction along the central axis of the through hole 6 denotes that the crystal extends in the direction substantially along the central axis of the through hole 6. In other words, the direction which crystal extends is substantially along the central axis of the through hole 6. Therefore, the angle of the direction which crystal extends relative to the central axis of the through hole 6 may be 0 to 30 degrees, more specifically 0 to 10 degrees.

When the wiring conductor 3 exposed in the through hole 6 is etched, an etching solution is flown through the through hole 6. As shown in the region Y in FIG. 5B, the corner between the wall surface of the through hole 6 and the through-hole conductor 3a on the upstream side of the flow of the etching solution has a tapered shape and is rounded. Thus, having a tapered shape with a corner rounded makes the plating solution during forming the through-hole conductor 3a easier to flow in the direction of the wiring conductor 3.

Figure 6:
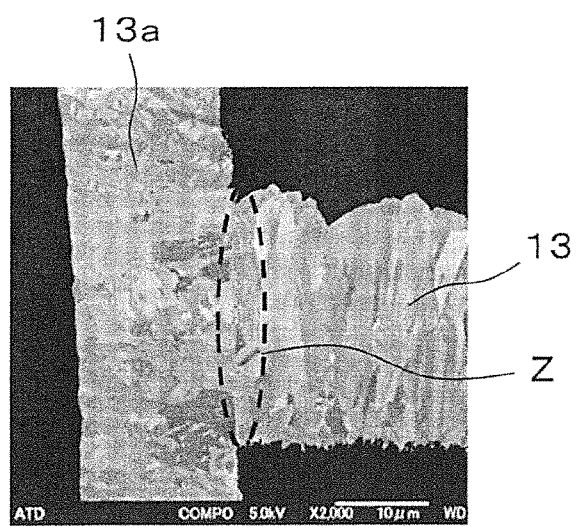
FIG. 6 is an electron micrograph showing a boundary surface between a wiring conductor and a through-hole conductor in a conventional printed wiring board.

As shown in FIG. 6, the boundary surface between the wiring conductor 13 and the through-hole conductor 13a in the conventional printed wiring board appears relatively clearly near the wall surface of the through hole as shown in the region Z. If the boundary surface between the wiring conductor 13 and the through-hole conductor 13a exists near the wall surface of the through hole, for example, when a load is applied to a printed wiring board, breakage is likely to occur between the conductor crystal forming the wiring conductor 13 and the conductor crystal forming the through-hole conductor 13a, and continuity failure is likely to occur. On the other hand, the printed wiring board of the present disclosure is excellent in signal propagation or power supply characteristics.

In the above-described embodiment, a case where the through-hole conductor 3a is cylindrical is described. Apart from this case, if the hole-filling resin 7 or the recess 8 is not required, the through-hole conductor 3a may fill the through hole 6. In this case, the electrical resistance of the through-hole conductor 3a is reduced. Therefore, it is advantageous from the viewpoint of signal propagation or improvement in power supply characteristics.

What is claimed is:
1. A printed wiring board comprising:
   a plurality of insulating layers laminated in a thickness direction;
   a plurality of wiring conductors respectively correspondingly positioned between the plurality of insulating layers;
   a through hole penetrating the plurality of insulating layers and the plurality of wiring conductors in the thickness direction; and
   a through-hole conductor positioned on a wall surface of the through hole,
   wherein
      each of the plurality of wiring conductors has a first surface facing the through hole,
      each of the plurality of insulating layers has a second surface facing the through hole,
      the first surface is farther away from a central axis penetrating the through hole in the thickness direction than the second surface, and
      each of the plurality of wiring conductors and the through-hole conductor are in contact with each other on the first surface.
2. The printed wiring board according to claim 1, wherein the through-hole conductor has a cylindrical shape.

3. The printed wiring board according to claim 2, wherein an inside of the cylindrical shape is filled with a resin.

4. The printed wiring board according to claim 2, wherein the through-hole conductor has a portion located so as to correspond to the first surface and the portion has a recess.

5. The printed wiring board according to claim 4, wherein the recess is annular shape.

6. The printed wiring board according to claim 1, wherein a boundary between the first surface and the through-hole conductor is nonlinearly intertwined.

7. The printed wiring board according to claim 1, wherein each of the plurality of wiring conductors has a crystal extending in a direction along the central axis of the through hole.

8. The printed wiring board according to claim 1, wherein
the through-hole conductor comprises a first portion facing the first surface and a second portion facing the second surface and a third portion located between the first portion and the second surface, and
the third portion has a tapered shape.

* * * * *